United States Patent [19]

Apel

[11] Patent Number: 4,540,954
[45] Date of Patent: * Sep. 10, 1985

[54] SINGLY TERMINATED DISTRIBUTED AMPLIFIER

[75] Inventor: Thomas R. Apel, Cedar Rapids, Iowa

[73] Assignee: Rockwell International Corporation, El Segundo, Calif.

[*] Notice: The portion of the term of this patent subsequent to May 1, 2001 has been disclaimed.

[21] Appl. No.: 444,290

[22] Filed: Nov. 24, 1982

[51] Int. Cl.³ .............................................. H03F 3/60
[52] U.S. Cl. ...................................... 330/286; 330/54
[58] Field of Search ................................... 330/54–56, 330/57, 286, 307, 269

[56] References Cited

U.S. PATENT DOCUMENTS 3,210,682 10/1965 Sosin ...................................... 330/54
3,451,004 6/1969 Miller et al. ........................... 330/54
4,446,445 5/1984 Apel ..................................... 330/286

FOREIGN PATENT DOCUMENTS 252996 7/1966 Austria ................................. 330/54

Primary Examiner—Eugene LaRoche
Assistant Examiner—G. Wan
Attorney, Agent, or Firm—Robert C. Mayes; George A. Montanye; H. Fredrick Hamann

[57] ABSTRACT

A broadband distributed amplifier capable of amplifying frequencies from zero to 20 Gigahertz is disclosed having a singly terminated output. The singly terminated construction of the amplifier precludes the need for a termination resistor on the output and thereby enables substantially all of the output power to be utilized.

12 Claims, 3 Drawing Figures

SINGLY TERMINATED DISTRIBUTED AMPLIFIER

CROSS-REFERENCE

Cross-reference is made to related application Ser. No. 444,283 entitled "Singly Terminated Push-Pull Distributed Amplifier", filed on even date herewith, now U.S. Pat. No. 4,446,445.

BACKGROUND OF THE INVENTION

The "distributed amplifier" has been used for extremely broadband amplifiers and which have a flat frequency response from essentially direct current all the way to as high as several tens of gigahertz. The use of the distributed amplifier or traveling wave amplifier was reported by Edward L. Ginzton, et.al., in a paper entitled "Distributed Amplification" published August, 1948 in the *Proceedings of the IRE*. The concepts in that paper are useful background for the present invention and that paper is incorporated herein by reference thereto.

That paper mentions, on page 962 under the heading "Tapered Plate Lines" an impedance matching technique for a vacuum tube circuit which enables several distributed amplifier stages to be coupled to maximize the gain by properly matching the impedance from one stage to the next.

More recently, several articles have been published relating to distributed amplifiers and traveling wave amplifiers having an integrated circuit structure in keeping with the advance of technology in this area. However, a continuing problem exists with respect to having a major portion of the output power being dissipated through the dual termination construction of the present state-of-the-art. A paper entitled "A DC-12 GHz Monolithic GaAs FET Distributed Amplifier" by Eric Strid, et.al., published July 1982 in the *IEEE Transactions on Microwave Theory and Techniques* shows a method of manufacturing a state-of-the-art distributed amplifier. A second paper entitled "A Monolithic GaAs 1-13 GHz Traveling Wave Amplifier" by Yalcin Ayasli, et.al., published July 1982, *IEEE Transactions on Microwave Theory and Techniques* discloses again a doubly terminated technique wherein at certain frequencies, significant portions of the output power are diverted through the output termination and thereby approximately 50% of the output power is wasted.

To improve the understanding of the "image method" for filter design utilized in the above incorporated publications as well as in the present application, chapter 3 entitled "Principles of the Image Method for Filter Design" from a leading text in this area entitled *Microwave Filters, Impedance-Matching Networks, and Coupling Structures* by George L. Matthaei, et.al., is recommended as useful background and chapter 3, pages 49 to 81, of that text are hereby incorporated by reference.

SUMMARY OF THE INVENTION AND BRIEF DESCRIPTION OF THE DRAWINGS

Accordingly, it is an object of the present invention to provide a monolithic distributed amplifier having a singly terminated output.

Another object of the present invention is to provide a traveling wave amplifier wherein essentially all of the output power is provided to the output precluding the need for an internal termination resistance.

Briefly, in accordance with the present invention, a distributed amplifier has a singly terminated output and comprises an integrated circuit substrate, a plurality of active amplifier devices mounted on the substrate with electrical interconnection, each to the others, to form a distributed amplifier; and the electrical interconnection having a phase difference between the active devices resulting in substantially all of the amplifier power being output to the singly terminated output.

The devices are interconnected wherein the gate or input connections are essentially in parallel (at the lower frequencies) and the output or drain connections are cascaded with an increasing capacitive susceptance toward the output and a decreasing inductive reactance toward the output, resulting in the requirement for a single termination, essentially the load, and therefore an increased gain as well as eliminating the requirement for a drain termination resistor on the integrated circuit or interconnection provisions for connection to the drain termination resistor.

A plurality of amplification stages, each having several amplifiers, are connected to further increase the gain of the overall device.

The frequency response of a device built in accordance with the present invention is from zero to 20 GHz, and by utilization of metal oxide capacitors for the capacitive reactance change on the device, and the use of controlled wire bonding or photolithographic metalization on the integrated circuit to control the inductive reactance change, the entire device is manufactured on a single integrated circuit.

DETAILED DESCRIPTION OF THE INVENTION

Figure 1:
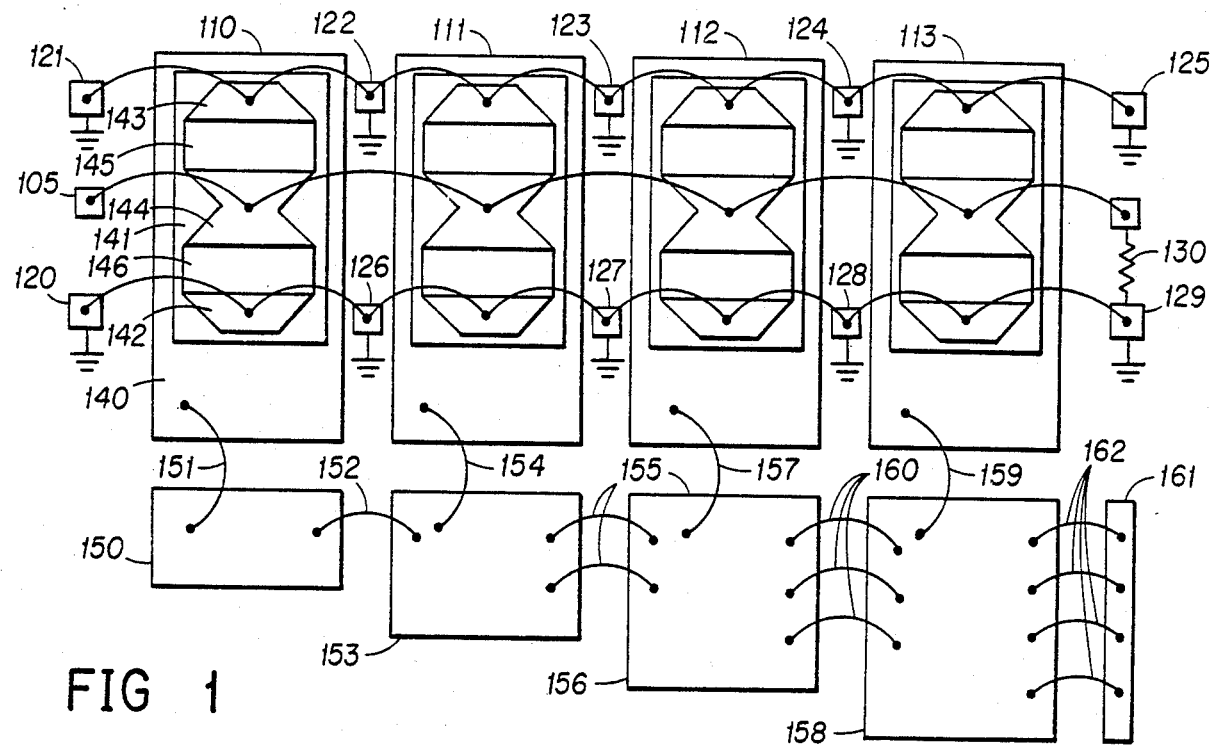
FIG. 1 is a schematic diagram of a distributed amplifier in accordance with the present invention wherein the described embodiment has four amplifier devices interconnected with wire bonding.

Referring now to FIG. 1, one embodiment of the present invention is shown utilizing N-channel metal oxide silicon field effect transistors 110, 111, 112 and 113, shown as they are constructed on a single substrate. In the shown embodiment, the transistor 110 has dual sourcing 143 and 142 and a single gate 144. Each of the transistors 111, 112 and 113 are essentially similar to the construction of transistor 110 and each is dual sourced through the grounding pads 121, 122, 123, 124, and 125 for one of the sources of each of the transistors, and through grounding pads 120, 126, 127, 128 and 129 the second source of each of the transistors is also grounded. The gates or amplifier inputs are connected in electrical parallel and the input pad 105 is wire bonded to gate 144 and from there to each of the gates of the amplifier and also to the gate termination resistor 130. Region 146 and region 145 on transistor 110 are active regions and region 141 is an isolation region for providing insulation between the gate, active regions, and source of the devices as well as from drain region 140.

As previously stated, the transistors 111, 112, and 113 are constructed similarly to transistor 110 and therefore operate in a similar manner. The bond wire 151 connects the drain 140 of transistor 110 to the metalization 150 and furthermore metalization 150 is connected through bond wire 152 to metalization 153. The bond wire 154 connects the drain of transistor 111 to the metalization 153 as does bond wire 157 connect the drain of transistor 112 to the metalization 156 and bond wire 159 connect the drain of transistor 113 to metalization 158.

It can be seen that the wire bond proceeding from the metalization 150 to 153 consists of a single bond wire. When proceeding from metalization 153 to 156 there are two bond wires 155 and from metalization 156 to 158 there are three bond wires 160. Finally in the present embodiment, there are four bond wires 162 going from metalization 158 to the output pad 161. This increasing in the number of bond wires from one output capacitor to the next results in an inductive reactance decrease as a direct function of the number of active devices in the amplifier. For example, the third transistor from the input, transistor 112 from input 105, utilizes three bond wires 160 to connect to the fourth transistor 113 in the amplifier, and therefore the inductance reactance decreases from each of the amplifiers to the next as a direct function of the number of active devices in the amplifier.

Additionally, the size of the metalization patterns 150, 153, 156 and 158 increases resulting in a capacitive reactance decrease also as a direct function of the number of active devices. The capacitive susceptance (the reciprocal of reactance) therefore increases as a direct function of the number of active devices.

The phase relationships of one output node to the next are substantially uniform even though the impedance decreases towards the output. This enables the amplifier to produce substantially the same output power as a doubly terminated amplifier; however, since the output is singly terminated, there is no loss of output power in an output termination or "dummy" resistor. The use of image parameter theory and constant-k derivation for developing an equivalent circuit of a transmission line model enables the designer to prescibe the desired capacitance and inductance for the circuit to achieve a specified operating characteristic.

Figure 2:
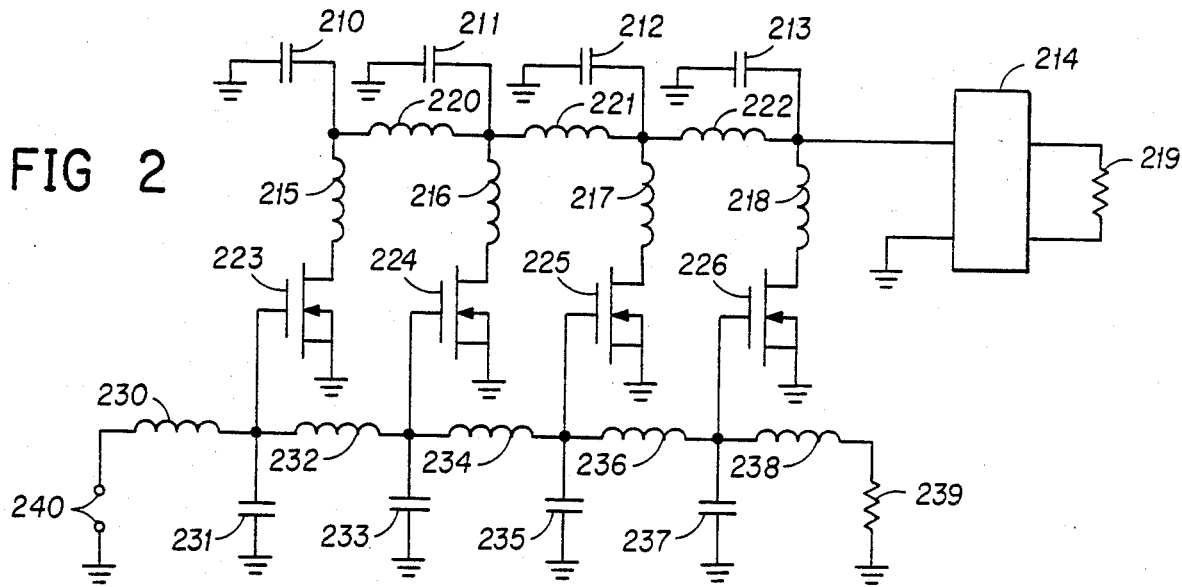
FIG. 2 is a schematic circuit diagram of the amplifier shown in FIG. 1 wherein the impedance of the wire bonding and the capacitance of the various circuit components are shown in an equivalent circuit diagram.

Referring now to FIG. 2, an equivalent circuit diagram is shown representing the device in FIG. 1. The grounded source MOSFETs 223, 224, 225, 226 correspond to transistors 110, 111, 112, and 113 in FIG. 1. The input 240 represents a connection from ground 120 in FIG. 1 to pad 105 and inductance 230 in FIG. 2 represents the inductance in the bond wire connecting pad 105 to gate 144 in FIG. 1. The gates of the MOSFETs in FIG. 2 are connected by inductances 232, 234, 236 and 238 and to termination resistor 239. The gate termination resistor 239 corresponds to the gate termination resistor 130 in FIG. 1. The inductances between the gates of the MOSFETs are primarily a result of the bond wire inductance. The capacitors 231, 233, 235 and 237 represent the capacitance from the gate of the respective transistor to ground resulting from both the internal capacitance of the device and the metalization capacitance to ground. On the output side the drain of transistor 223 is connected through inductance 215 to inductance 220 representing bond wire 152 in FIG. 1 and to capacitance 210 representing the capacitance of metalization 150 in FIG. 1.

Likewise, transistor 224, 225, and 226 are also connected through bond wires to have the respective inductances shown as 216, 217 and 218 and the inductances 220, 221 and 222 will have a decreasing inductance value from MOSFET 223 proceeding to the output 219 through transformer 214 while the capacitors 210, 211, 212 and 213 will increase in value proceeding from the connection to transistor 223 to transistor 226.

The following design parameters are fixed in this exemplary embodiment for purposes of description only. The desired output resistance is set at 50 ohms and this requires that the square root of the quanti $L_k/C_k$ is equal to 50 ohms.

Additionally, the operating frequency desired in this exemplary embodiment is set at $10^{10}$ radians/second, or $1.59 \times 10^9$ Hz and this is equal to the quantity $1/[$square root of $(L_k C_k)]$. Solving for $L_k$ in each of the above formulas, we obtain $L_k = 50^2 \ C_k$ and $L_k = 1/10^{20}/C_k$. Setting these equal provides $50^2 \ C_k = 1/10^{20} \ (C_k)$ and therefore $C_k = 2$ picofarads. Inserting $C_k$ into either of the above formulas provides $L_k = 5$ nanohenries. Thus, for the gate net of the schematic in FIG. 2 the input impedance is equal to 50 ohms, and inductance 230 is equal to 5 nanohenries. The remaining portions of the input or gate net are essentially "lumped" as used in U.S. Pat. No. 3,969,752 to Martin, et.al., issued July 13, 1976, and an inductive value in an equivalent circuit such as FIG. 2 is provided for each of the nodes with respect to the others such that the value of the inductance for inductor 232 is 10 nanohenries, as are inductors 234 and 236 while inductor 238 is again 5 nanohenries and resistor 239 is 50 ohms. The capacitance from the gate of the MOSFETs to ground is shown as capacitor 231 for transistor 223 and is 3 picofarads as are capacitors 233, 235, and 237. The 3 picofarad value for the capacitors is obtained in the following manner. The desired capacitance on the input net going into the gates is 4 picofarads ($2C_k$). Since the input capacitance into the gate of the utilized MOSFETs is 1 picofarad, the difference and therefore the required capacitance for capacitors 231, 233, 235 and 237 is 3 picofarads.

With respect to the drain net or output side of the circuit, the capacitance of the devices used in this embodiment, N-channel depletion mode MOSFETs, have a drain capacitance of approximately 1 picofarad and a gate capacitance of approximately 1 picofarad. Since our frequency has previously been defined as $10^{10}$ radians/second, the inductance 215 from the drain of transistor 223 is a lumped inductance as are inductances 216, 217 and 218 and are all 20 nanohenries. The cascaded inductances 220, 221 and 222 have a reduced inductance by virtue of having the increased numbers of bond wires wherein inductance 220 is 20 nanohenries, inductance 221 is 10 nanohenries and inductance 222 is 6.667 nanohenries. The capacitance 210 is equal to twice the lumped output capacitance of transistor 223 and is 2 picofarads. Capacitor 211 is larger than capacitor 210 as is shown in FIG. 1 by the comparison of metalization 153 to metalization 150 and therefore the value of the capacitance for capacitor 211 is somewhat larger, 4 picofarads, while capacitor 212 is 6 picofarads and capacitor 213 is 4 picofarads. While the formula for the drain network capacitors is $(N - X)C$ where N is the number of active devices and X is the respective number of the device counting from the output resulting in the above values, the last capacitor, in this case capacitor 213 has a value described by the formula NC/2, resulting in 4 picofarads.

This results in an output impedance of 25 ohms to transformer 214 which converts the 25 ohm output to a 50 ohm load 219. It should be noted that multiple stages of amplifiers may be coupled end to end to provide increased gain and in this manner the traveling wave or distributed portion has four or more amplifier devices and the output is then input into a second distributed or traveling wave amplifier again having four, five, six or more amplifying devices to provide an increased gain.

Figure 3:
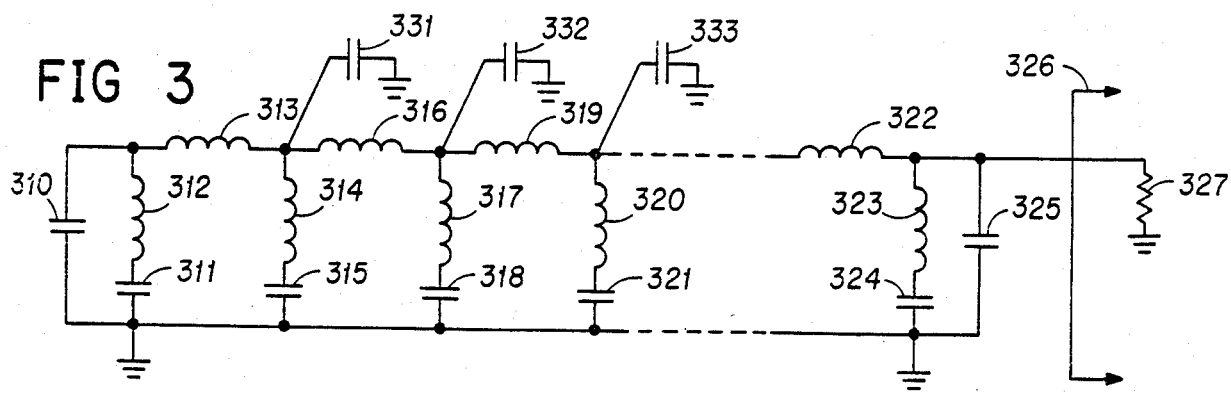
FIG. 3 is a simplified equivalent circuit diagram of the traveling wave amplifier shown in FIG. 1 wherein the impedances have been lumped together as have the capacitances for simplifying the mathematic derivation.

Referring now to FIG. 3, a generalized derivation for a simplified equivalent circuit is developed from the lumped impedance network shown in FIG. 3 wherein capacitor 310 is essentially twice the circuit capacitance figure derived in the above formulas and inductor 313 as well as inductor 312 is essentially twice the value of the inductor derived in the above equations. Inductors 312, 313, 317 and 320 are all $2 \times L_k$ as a result of combining the schematic representations of each of the amplifier devices to each other. Thus, capacitor 310 is $2C_k$, capacitor 311, 315, 318, 321 and 324 are all $1 \times C_k$ and capacitor 331 is 2 x capacitor 310 which is, in this embodiment, 4 $C_k$, capacitor 332 is 3 x capacitor 310 or 6 $C_k$, and capacitor 333 is 4 x value of capacitor 310 or 8 $C_k$. This leaves a generalized formula for a multiple device distributed amplifier wherein the inductor 322 has a value corresponding to $2L_k$/(the number of stages) minus 1. Inductor 323 has a value of $2L_k$, capacitor 324 in series with inductor 323 has a value of $C_k$, and capacitor 325 has a value of the number of devices times $C_k$. Section line 326 marking the external load has a resistance 327 on the output equal to the input resistance divided by N, where N is the number of devices in the amplifier stage.

It should be noted in this embodiment the wire bonding is used to control the inductive values of the interconnections between the devices in the stage; however, photolithographic techniques providing metalized interconnection lines utilizing a photo etch and deposition process such as sputtering, for example, may also be used if the metalization is controllable to the extent that the inductive reactance value may be closely controlled.

Also important in this example is the value of $C_k$ of 1 picofarad, which matches closely the value of an N-channel MOSFET device built on a silicon substrate. Gallium arsenide devices, as well as other compositions of substrate material may be utilized, and additionally the various channel types and modes may result in alternative embodiments and various values for $C_k$ resulting in changes to the design values for $L_k$ to result in a proper operating frequency. These values are derived in a known manner as described as the constant-k derived values from the image point of view as is described in chapter 3 of the above-referenced Matthaei text.

A significant advantage of the present embodiment is elimination of the requirement for a drain termination resistor resulting in substantially all of the power output from each of the devices in the amplifier stage being delivered to the stage output. The savings in output power are significant resulting in improvements in amplifier gain, 18 dB gain in the present example, and the lessened need for substrate area to provide an internal termination resistor or in the alternative, saving the interconnection area to an external resistor providing sufficient resistance to handle 50% of the design load.

Additionally, this single termination technique is readily adapted to the input or gate network, although instead of resulting in single termination, it will result in smaller individual gate terminations, and will facilitate single substrate fabrication of the device.

While the present description of the invention is made with respect to a specific embodiment, it can be seen that the circuit technique is not limited to that embodiment, but may be adapted to a variety of applications and devices such as MESFETs, JFETs, and others as may become obvious to those skilled in the art. Since modifications to the foregoing description may occur to those skilled in the art which very well may not constitute a departure from the scope and spirit of the invention, the description is intended to be merely exemplary and it is therefore contemplated that the appended claims will cover any such modification of embodiments as fall within the true scope of the invention.

What is claimed is:

1. An integrated circuit comprising:
   a. a plurality of amplifying means for amplifying an input signal and mounted on a semiconductor substrate; and
   b. means for interconnection of said amplifying means, each to the others, to form an amplification stage, said means for interconnection having a dissimilar susceptance and reactance for each connection from the susceptance and reactance of the other connection means, the dissimilarity a function of the total number of amplifying means in said stage and resulting in substantially all of the output of said amplifying means being provided to a singly terminated output.

2. An integrated circuit as in claim 1 wherein said input signal has a frequency from 0 to 20 Gigahertz.

3. An integrated circuit as in claim 1 wherein said means for interconnection comprises metal oxide capacitors.

4. An integrated circuit as in claim 1 wherein said means for interconnection comprises wire bonding.

5. An integrated circuit as in claim 1 wherein said means for interconnection comprises photolithographic metalization.

6. An integrated circuit as in claim 1 wherein said means for amplifying comprises N-channel field effect transistors.

7. A distributed amplifier having a singly terminated output comprising:
   a. an integrated circuit substrate;
   b. a plurality of active amplifier devices mounted on said substrate with electrical interconnection, each to the others, to form a distributed amplifier; and
   c. said electrical interconnection having a reactance difference between said active devices resulting in substantially all of the amplifier power being output to said singly terminated output.

8. A traveling wave amplifier comprising:
   a. a plurality of amplifying devices on a single substrate, each of said devices interconnected with the others in a phase shifting parallel configuration and to a singly terminated output; and
   b. a phase difference in said interconnections, each from the others, such that substantially all of the power from said devices is output to said singly terminated output, said phase difference having a capacitive susceptance increasing toward the output as a direct function of the number of amplifying devices, from one device to the next, and also having inductive reactance decreasing toward the output as a direct function of the number of amplifying devices, from one device to the next.

9. An amplifier as in claim 8 wherein said interconnections comprise metal oxide capacitors.

10. An amplifier as in claim 8 wherein said interconnections comprise wire bonding.

11. An amplifier as in claim 8 wherein said interconnections comprise photolithographic metalization.

12. An amplifier as in claim 8 wherein said amplifying devices comprise N-channel field effect transistors.

* * * * *